US008013493B2

(12) United States Patent
Van Der Avoort

(10) Patent No.: US 8,013,493 B2
(45) Date of Patent: Sep. 6, 2011

(54) MEMS RESONATORS

(75) Inventor: Casper Van Der Avoort, Waalre (NL)

(73) Assignee: NXP B.V., Eindhoven (NL)

( * ) Notice: Subject to any disclaimer, the term of this patent is extended or adjusted under 35 U.S.C. 154(b) by 1 day.

(21) Appl. No.: 12/601,038

(22) PCT Filed: May 28, 2008

(86) PCT No.: PCT/IB2008/052088
§ 371 (c)(1),
(2), (4) Date: Nov. 20, 2009

(87) PCT Pub. No.: WO2008/146244
PCT Pub. Date: Dec. 4, 2008

(65) Prior Publication Data
US 2010/0283353 A1 Nov. 11, 2010

(30) Foreign Application Priority Data
Jun. 1, 2007 (EP) .................................. 07109409

(51) Int. Cl.
*H02N 1/00* (2006.01)
(52) U.S. Cl. .......................................... 310/309; 73/779
(58) Field of Classification Search .................. 310/309; 73/105, 517
See application file for complete search history.

(56) References Cited

U.S. PATENT DOCUMENTS

| 3,614,678 | A | | 10/1971 | Engeler et al. | |
|---|---|---|---|---|---|
| 5,908,981 | A | * | 6/1999 | Atalar et al. | 73/105 |
| 6,075,585 | A | * | 6/2000 | Minne et al. | 355/71 |
| 2002/0092359 | A1 | * | 7/2002 | Lange et al. | 73/779 |
| 2004/0244488 | A1 | * | 12/2004 | Tang et al. | 73/579 |
| 2006/0125347 | A1 | * | 6/2006 | Yoda et al. | 310/309 |
| 2010/0000292 | A1 | * | 1/2010 | Karabacak et al. | 73/24.01 |
| 2011/0061452 | A1 | * | 3/2011 | King et al. | 73/105 |

FOREIGN PATENT DOCUMENTS

| WO | 2004/053431 A | 6/2004 |
|---|---|---|
| WO | 2007/036852 A | 4/2007 |

OTHER PUBLICATIONS

Meirovitch, L.; "Elements of Vabration Analysis"; Mc-Graw-Hill; 1986; pp. 266-275.

Van Beek, J T M, et al; "A 10MHZ Piezoresistive MEMS Resonator With High Q"; International Frequency Control Symposium and Exposition; 2006; IEEE; PI; Jun. 1, 2006; pp. 475-480; XP031003746; ISBN: 978-1-4244-0074-4.

(Continued)

*Primary Examiner* — Mark Budd

(57) ABSTRACT

A MEMS piezoresistive resonator (8, 78) is driven at a higher order eigenmode (32) than the fundamental eigenmode (31). The route of flow of a sense current (22) is arranged in relation to a characteristic of the higher order eigenmode (32), for example by being at a point of maximum displacement (50) or at a point of maximum rate of change with respect to distance (x) of displacement of the higher order eigenmode (32). The route of flow of the sense current (22) may be arranged by fabricating the MEMS piezoresistive resonator (8, 78) with a trench (15) formed between two beams (11, 12) of the MEMS piezoresistive resonator (8, 78), the end of the trench being located at the above mentioned position.

8 Claims, 7 Drawing Sheets

OTHER PUBLICATIONS

Demirci, M U; et al; "Higher-Mode Free-Free Beam Micromechanical Resonators"; Proceedings of the 2003 IEEE International Frequency Control Symposium & PDA Exhibition Jointly With the 17th European Frequency and Time Forum; Tampa, FL, US; May 4-8, 2003; pp. 810-818; XP010588962; ISBN: 978-0-7803-7688-5.

Jin, Zhonghe, et al; "Electrostatic Resonator With Second Superharmonic Resonance"; Elsevier Sensors and Actuators; Jan. 1998; p. 1-9; XP004116356.

Zurn, S., et al; "Fabrication and Structural Characterization of a Resonant Frequency PZT Microcantilever"; Institute of Physics Publishing—Smart Materials and Structures; 2001; pp. 252-263.

* cited by examiner

MEMS RESONATORS

The present invention relates to MEMS resonators, more particularly to MEMS piezoresistive resonators, and the driving thereof.

Micro-Electro Mechanical System (MEMS) resonators are known. MEMS resonators are formed from, for example, doped silicon, and are considered as a possible replacement for quartz crystal oscillators in applications of tuneable oscillators such as mobile telephones.

One particular type of MEMS resonator is a MEMS piezoresistive resonator. A MEMS piezoresistive resonator is a longitudinal mode resonator whose excitation is induced by electrostatic actuation and sensing of which is performed by sensing the piezoresistive effect of the doped material, typically silicon, forming the resonator. Such a MEMS piezoresistive resonator is described in WO 2004/053431, the contents of which are incorporated herein by reference.

The way in which a MEMS resonator functions is usually considered as corresponding to that of a lumped mass and a massless spring.

Conventionally, MEMS piezoresistive resonators are operated at their fundamental eigenmode. The fundamental eigenmode provides the fundamental resonant frequency $f_0$ when considering only longitudinal vibration, i.e. in the direction of actuation, rather than bending. This ties in with the conventional understanding of the above mentioned consideration of the way a MEMS resonator functions, since a resonator comprising a lumped mass and a massless spring only has one resonant frequency, the fundamental resonant frequency $f_0$.

The present inventor has realised that the physical effects involved in the operation of specifically a MEMS piezoresistive resonator allow the possibility to use higher order eigenmodes, i.e. additional eigenmodes that occur at higher frequencies than the frequency at which the fundamental eigenmode occurs. Such higher order eigenmodes may be considered as, or called, higher harmonics. The present inventor has further realised that analysis of the characteristics of the higher order eigenmodes allows a possibility for surprising performance gains to be achieved by determining or specifying various design features of an MEMS piezoresistive resonator in relation to the characteristics of the higher order eigenmodes.

In a first aspect, the present invention provides a method of operating a MEMS piezoresistive resonator; the method comprising driving the MEMS piezoresistive resonator at a higher order eigenmode than the fundamental eigenmode.

The method may further comprise arranging a route of flow of a sense current in relation to a characteristic of the higher order eigenmode.

The route of flow of the sense current may be arranged in relation to the characteristic of the higher order eigenmode by being at a point of maximum displacement of the higher order eigenmode.

The route of flow of the sense current may be arranged in relation to the characteristic of the higher order eigenmode by being at a point of maximum rate of change with respect to distance of displacement of the higher order eigenmode.

The route of flow of the sense current may be arranged by locating the end point of a trench of the MEMS piezoresistive resonator at a position determined in relation to the characteristic of the higher order eigenmode, the trench being formed between two beams of the MEMS piezoresistive resonator.

In a further aspect, the present invention provides a method of fabricating a MEMS piezoresistive resonator; the method comprising fabricating the MEMS piezoresistive resonator such that the route of flow of a sense current in operation is arranged in relation to a characteristic of a higher order eigenmode of the MEMS piezoresistive resonator compared to the fundamental eigenmode of the MEMS piezoresistive resonator.

The route of flow of the sense current may be arranged in relation to the characteristic of the higher order eigenmode by being at a point of maximum displacement of the higher order eigenmode.

The route of flow of the sense current may be arranged in relation to the characteristic of the higher order eigenmode by being at a point of maximum rate of change with respect to distance of displacement of the higher order eigenmode.

The route of flow of the sense current may be arranged by fabricating the MEMS piezoresistive resonator with a trench formed between two beams of the MEMS piezoresistive resonator, the end of the trench being located at a position determined in relation to the characteristic of the higher order eigenmode.

In a further aspect, the present invention provides a MEMS piezoresistive resonator comprising a trench formed between two beams, the end of the trench located at a position of maximum displacement or maximum rate of change with respect to distance of displacement of a higher order eigenmode of the MEMS piezoresistive resonator.

The MEMS piezoresistive resonator may further comprise a head that is wider than the width of the overall footprint of the two beams, and the end of the trench may be located at a point along the beams that is before where the beams reach the head.

In a further aspect, the present invention provides a MEMS piezoresistive resonator system; the system comprising: a MEMS piezoresistive resonator; and a driver for the MEMS piezoresistive resonator arranged to drive the MEMS piezoresistive resonator at a frequency of a higher order eigenmode than the fundamental eigenmode of the MEMS piezoresistive resonator.

Embodiments of the present invention will now be described, by way of example, with reference to the accompanying drawings, in which.

Figure 3:
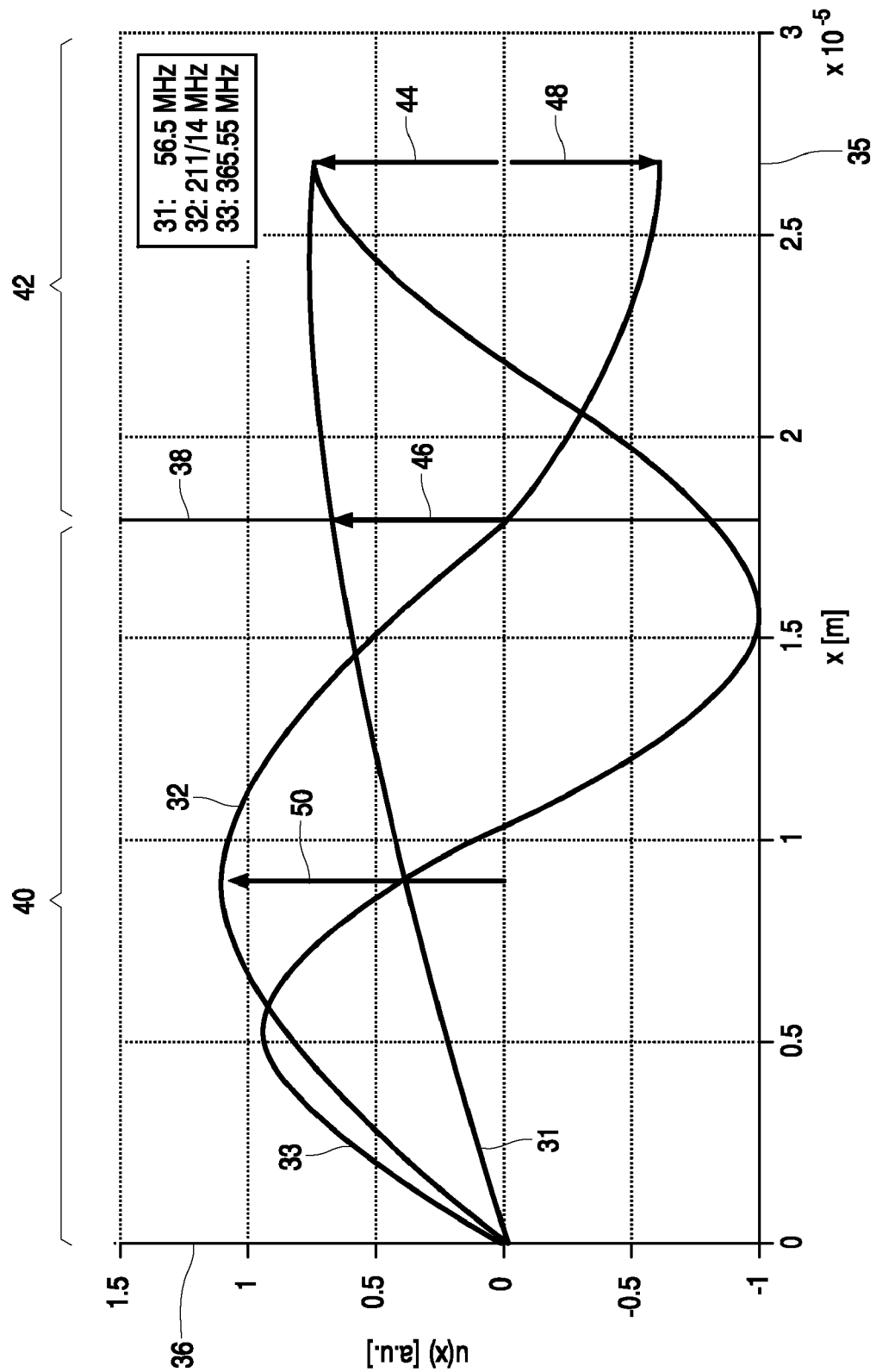
Figure 4:
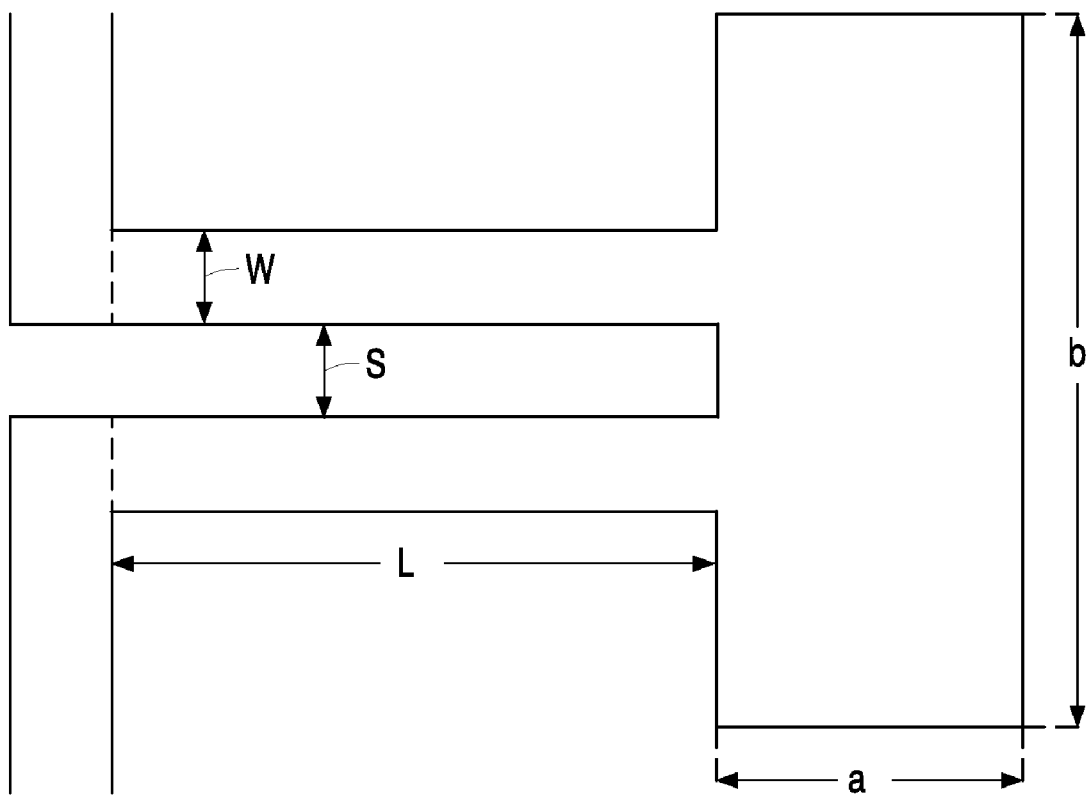
Figure 5:
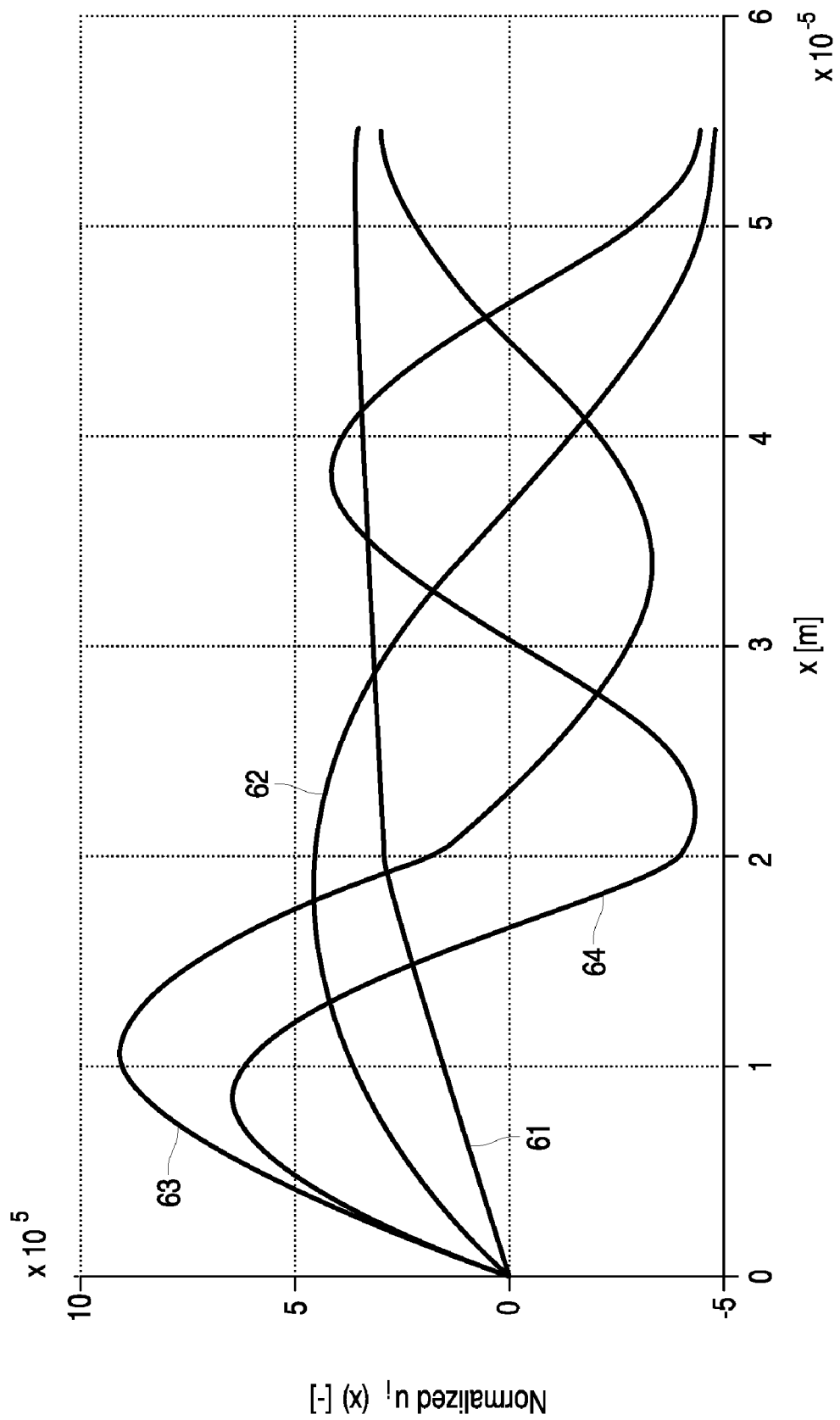
Figure 6:
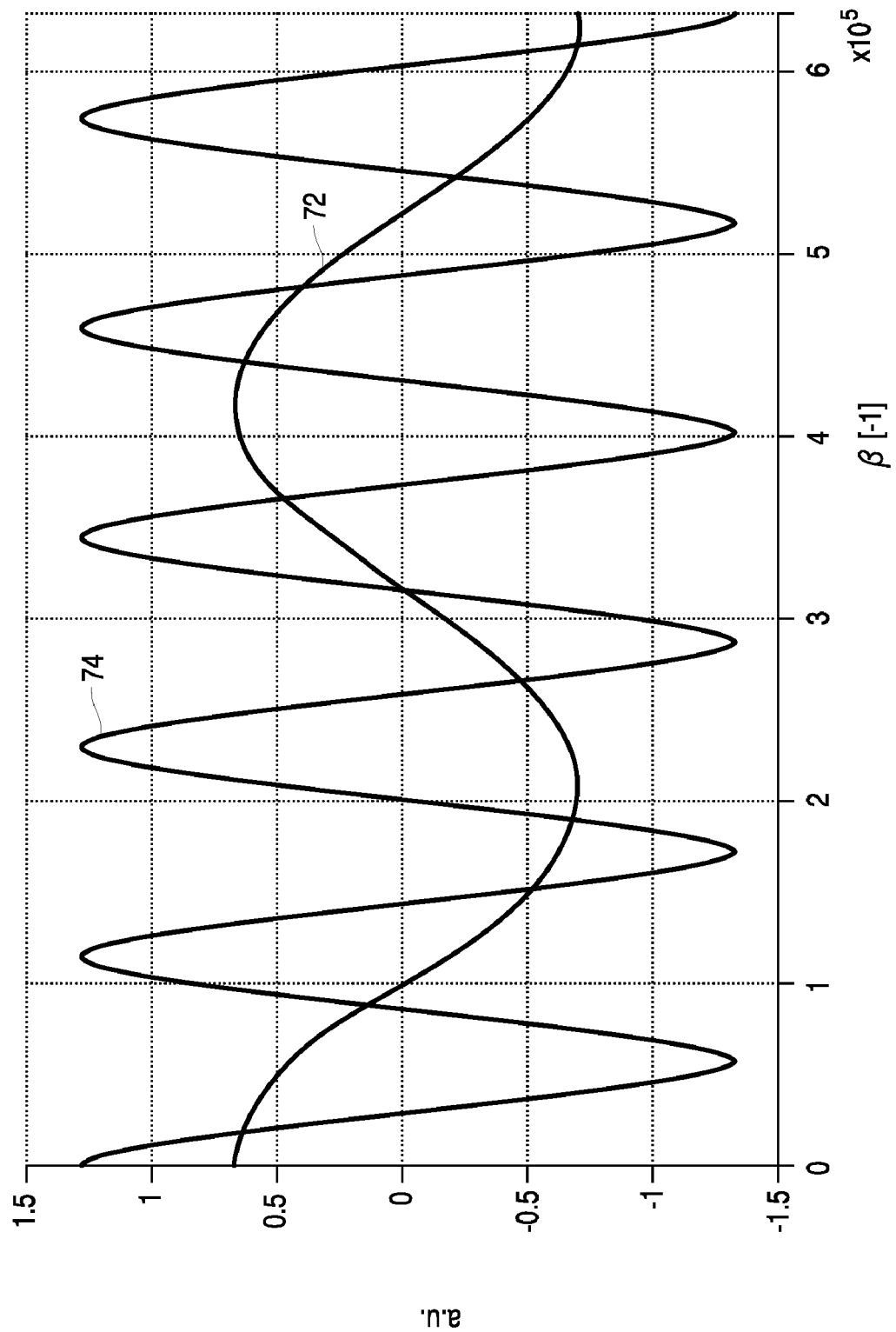
Figure 7:
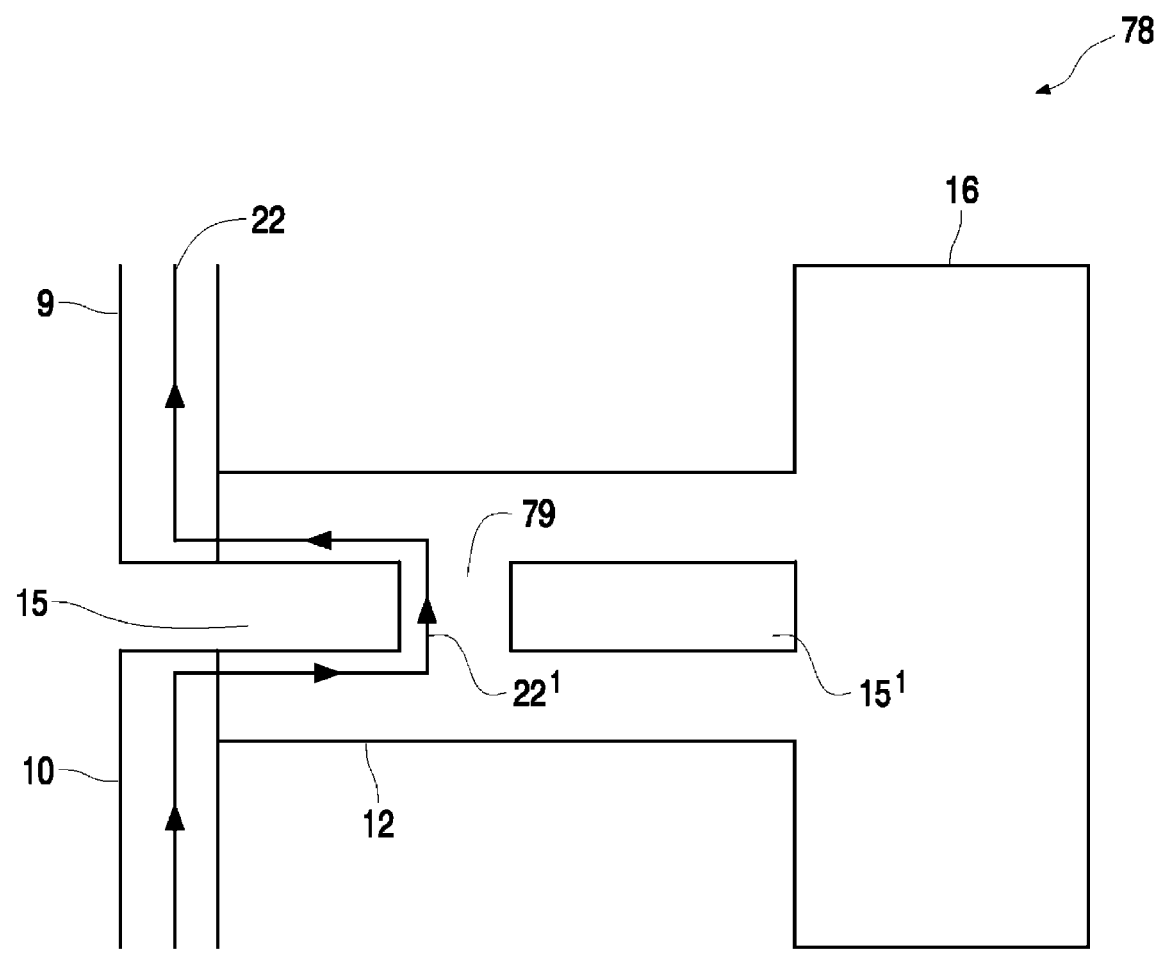

FIG. 3 three eigenmodes;

FIG. 4 shows a characterisation of the geometry of a resonator (not to scale);

FIG. 5 shows a plot of four normalized eigenfunctions;

FIG. 6 shows a representation of an equation where a first curve shows the left hand side of the equation and a second curve shows the right hand side of the equation; and FIG. 7 shows a further MEMS piezoresistive resonator (not to scale).

Figure 1:
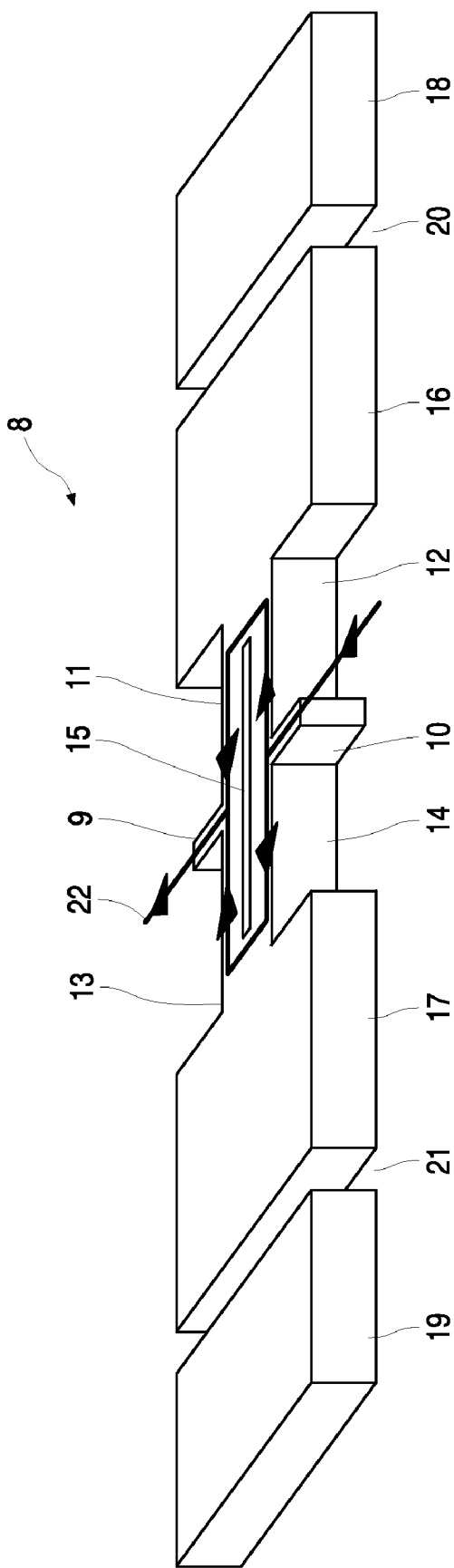
FIG. 1 is a schematic three-dimensional illustration (not to scale) of a MEMS piezoresistive resonator.

FIG. 1 is a schematic three-dimensional illustration (not to scale) of a MEMS piezoresistive resonator 8 of a first embodiment of the present invention. The MEMS piezoresistive resonator 8 is a longitudinal mode silicon resonator. The MEMS piezoresistive resonator 8 is made from doped silicon. In this embodiment, the MEMS piezoresistive resonator 8 comprises a first anchor 9 and a second anchor 10. The anchors 9, 10 connect the otherwise free-standing structure of the MEMS piezoresistive resonator 8 to a substrate (not shown). The MEMS piezoresistive resonator 8 further comprises four beams (also known as springs), namely a first beam 11, a second beam 12, a third beam 13 and a fourth beam 14. The MEMS piezoresistive resonator 8 further comprises two heads (also known as resonator masses or simply masses), namely a first head 16 and a second head 17. Each beam is attached to, and extends between, one of the anchors and one of the heads, as follows. The first beam 11 is attached to, and extends between, the first anchor 9 and the first head 16. The second beam 12 is attached to, and extends between, the second anchor 10 and the first head 16. The third beam 13 is attached to, and extends between, the first anchor 9 and the second head 17. The fourth beam 14 is attached to, and extends between, the second anchor 10 and the second head 17. In this embodiment, the beams are all straight, or at least substantially straight, and parallel. Moreover, in this embodiment, the first and second beams 11, 12 are symmetrical, or at least substantially symmetrical (relative to the anchors 9, 10) with the third and fourth beams 13, 14. The above described shape of MEMS piezoresistive resonator 8 may be referred to as a so-called "dogbone" shape.

The beams and heads together form a space therebetween which we shall hereinafter call a trench 15.

The MEMS piezoresistive resonator 8 further comprises two actuation electrodes, namely a first electrode 18 and a second electrode 19. The first electrode 18 is positioned at the end of the first head 16 that is furthest from the beams, with a first gap 20 between the first electrode 18 and the end of the first head 16. The second electrode 19 is positioned at the end of the second head 17 that is furthest from the beams, with a second gap 21 between the second electrode 19 and the end of the second head 17.

In operation, excitation of the resonator is induced by electrostatic actuation and sensing is done by piezoresistive effect of the doped silicon beams. In more detail, both an AC voltage and a DC voltage are applied to the electrodes 18, 19, to drive the resonator structure into resonant vibration. A sense current 22 is sent through the beams 11, 12, 13, 14 which form the resonator arms, via the anchors 9, 10, as shown in FIG. 1. Thanks to the piezoresistive effect of doped silicon, the vibration of the beams can be detected by measuring the resistance change of the beams 11, 12, 13, 14. The MEMS piezoresistive resonator 8 is typically driven in a feedback circuit comprising an amplifier in parallel with the MEMS piezoresistive resonator 8 such that an oscillator is provided.

It can be seen in FIG. 1 that in this embodiment the trench 15 extends part of the way along the beams to the respective heads, but not all the way. The extent to which the trench extends determines at which point along the length of the MEMS piezoresistive resonator 8 the sense current 22 flows across the MEMS piezoresistive resonator 8. The position to which the trench 15 extends, and hence the point along the length of the MEMS piezoresistive resonator 8 the sense current 22 flows across the MEMS piezoresistive resonator 8, is selected in relation to the characteristics of a higher order eigenmode at which the MEMS piezoresistive resonator 8 is driven, as will be explained in more detail below with reference to FIGS. 2 and 3.

Figure 2:
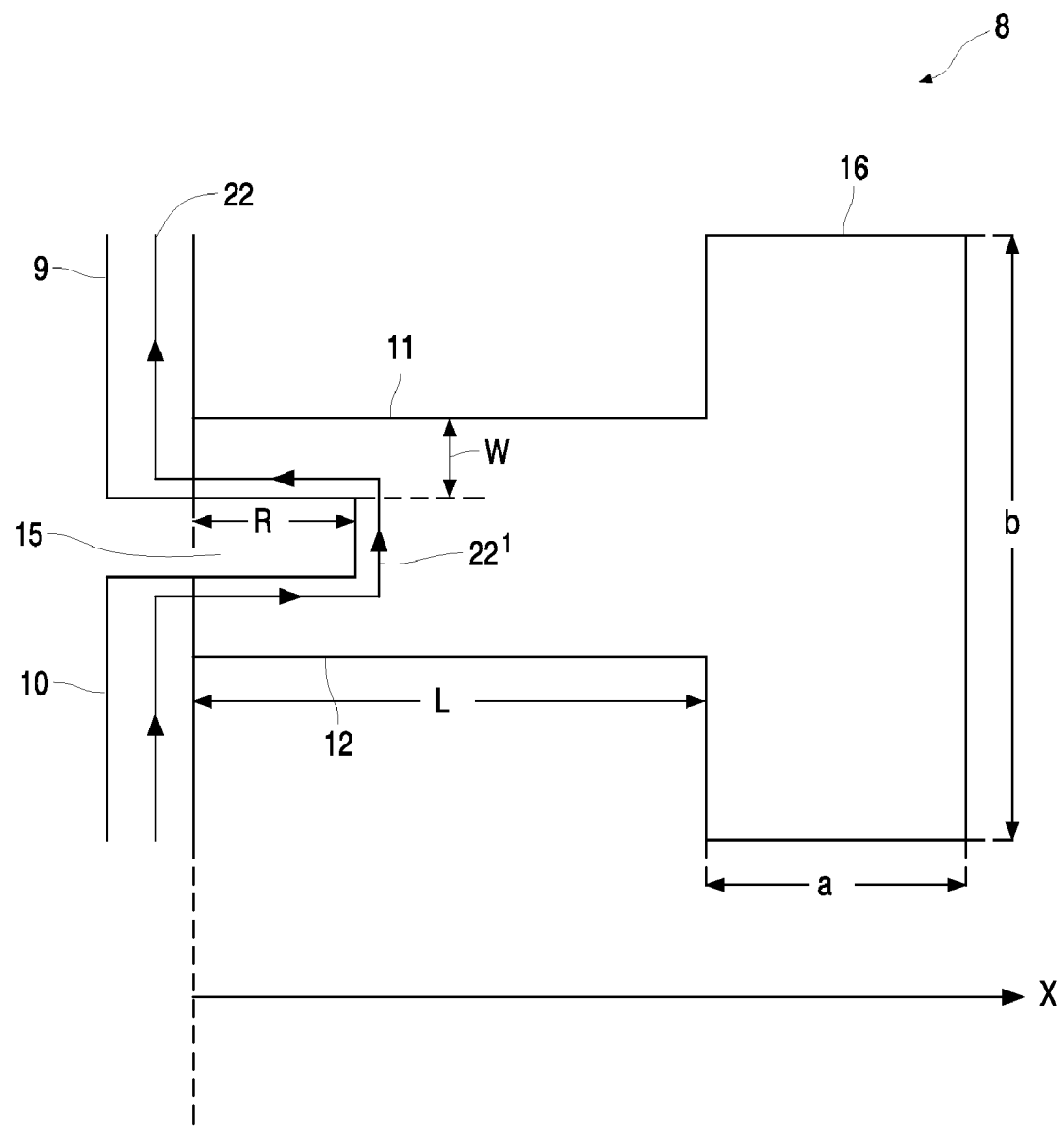
FIG. 2 is a schematic illustration (not to scale) of a MEMS piezoresistive resonator with the dimensions of certain parts thereof labelled.

FIG. 2 is a schematic illustration (not to scale) of the MEMS piezoresistive resonator 8 with the dimensions of certain parts thereof labelled. For simplicity only the structure located at one side of the anchors 9, 10 is shown in FIG. 2. In particular, FIG. 2 shows the first anchor 9, the second anchor 10, the first beam 11, the second beam 12, and the first head 16. Also shown schematically is the approximate route of the sense current 22, in particular where (shown by reference numeral 22' in FIG. 2) the sense current 22 crosses the MEMS piezoresistive resonator 8 at the end of the trench 15.

The following dimensions are labelled. W indicates the width of a beam 11, 12, 13, 14. L indicates the length or distance between the anchors 9, 10 and the heads 16, 17, which is therefore the length the trench 15 would be (starting from the anchors) if it extended all the way to the head. R indicates the distance from the anchors 9, 10 to the end of the trench 15. The length of the heads 16, 17 is indicated by "a". The width of the heads 16, 17 is indicated by "b". The variable "x" indicates the distance from the anchors in the direction of the head.

In this embodiment the above mentioned dimensions of the MEMS piezoresistive resonator 8 have the following values:

| | |
|---|---|
| L: | 17.75 μm; |
| w: | 5 μm; |
| a: | 8.9 μm; |
| b: | 20 μm; |
| R: | 8.9 μm. |

The width of the trench 15, i.e. the spacing between the beams, is 1 μm. The thickness of the material of the MEMS piezoresistive resonator 8 is 1.5 um, the material being silicon (on insulator). Relevant material properties of the silicon forming the MEMS piezoresistive resonator 8 are a Young's modulus of 181 GPa and a density of 2329 kg/m$^3$.

The frequency of the fundamental eigenmode of the above described MEMS piezoresistive resonator 8 is 56.5 MHz. However, in this embodiment, rather than being operated at its fundamental eigenmode, the MEMS piezoresistive resonator 8 is operated at a higher order eigenmode (higher harmonic), in particular at its second eigenmode, which in the case of the above described MEMS piezoresistive resonator 8 occurs at a frequency of 211.14 MHz. In an oscillator, the MEMS piezoresistive resonator 8 is driven at the required frequency, being the determined frequency of the selected higher eigenmode, by any suitable means, for example by suitable choice of the feedback amplifier's characteristics, as can be routinely implemented by the skilled person in the field of oscillator circuit design. An overview of such higher order eigenmode (harmonic) driving, and in particular how the choice of the above dimensions is inter-related with this, will now be given, including by reference to FIG. 3. Later below, further background considerations and analysis supporting the overview will be described with reference to FIGS. 4 to 6.

The resonator provided by MEMS piezoresistive resonator 8 can be considered to be a clamped rod with varying cross-sectional area, A(x). For such a rod, compressional (as opposed to bending) eigenfrequencies can be calculated. Standing waves are found, that match the boundary conditions of this system. Other names for these vibrations are bulk acoustic waves or standing pressure waves. In the case of solid material, these are the same as the longitudinal eigen-vibrations of the resonator. Using a one-dimensional, continuous model where only design lengths and material properties are used, the eigenfrequencies and corresponding modeshapes can be found analytically.

FIG. 3 shows, for MEMS piezoresistive resonator 8, three eigenmodes u(x) as derived by the one-dimensional model for calculating standing waves in a solid, in this case two parts with different cross-sectional area. The first eigenmode, i.e. at the fundamental frequency $f_0$, is indicated by reference numeral 31; the second eigenmode, i.e. the second harmonic, is indicated by reference numeral 32; and the third eigenmode, i.e. the third harmonic, is indicated by reference numeral 33.

In FIG. 3, the horizontal axis is distance x, and the vertical axis is "u(x)" which represents the normalised displacement of the resonator at position x.

The first eigenmode 31, i.e. at the fundamental frequency $f_0$, occurs at a frequency of 56.5 MHz. The second eigenmode 32, i.e. the second harmonic, occurs at a frequency of 211.14 MHz; and the third eigenmode 33, i.e. the third harmonic, occurs at a frequency of 365.55 MHz.

A vertical line 38 at approximately x=17.75 μm indicates the interface between the beams and the head, corresponding to the fact that L=17.75 μm as described earlier above with reference to FIG. 2, providing in effect a spring part 40 and a mass part 42.

The fundamental mode 31 describes, analogous to the mass-spring model, a linear slope of u(x) in the spring-part 40 and a much flatter u(x) in the head part 42. The strain in the material of the MEMS piezoresistive resonator 8 follows from the displacement, i.e. strain=du/dx. A massless spring would stretch with a constant strain all over the spring. A typical standing wave would be a non-constant strain.

The higher-order eigenmodes, i.e. harmonics, show that alternating compression and extension occur in both the spring part 40 and in the mass part 42. The spatial period of u(x) for any given eigenmode is the same in the spring part 40 as in the mass part 42, since the material and hence the material properties are the same in the spring part 40 as in the mass part 42. However, the amplitude of u(x) of any given eigenmode is different in the spring part 40 compared to in the mass part 42. It is believed by the inventor that this may be explained by the concept that in effect the heavier mass part 42 "swings-up" the lighter spring part 40. It is further believed by the inventor that the different eigenmodes each in effect balance harmonic deformation energy in both the spring part 40 and the head part 42.

The inventor has considered the different eigenmodes in terms of their potential for improved operation of the MEMS piezoresistive resonator 8. In particular, the inventor has considered various specific displacements shown in FIG. 3 by arrows, as follows: for the fundamental mode 31, the displacement 44 at the far end of the head approximately equals the displacement 46 at the interface of the beams and head (being the maximum displacement in the beams); however, for the second eigenmode 32, i.e. the second harmonic, the displacement 48 at the far end of the head is approximately equal to the displacement 44 at the far end of the head for the fundamental mode 31, whereas the maximum displacement in the beams is the displacement 50 at x=8.9 μm, this displacement 50 being considerably larger than the displacement 48 at the far end of the head. In other words, the maximum displacement in the spring part 40 is larger for the second eigenmode 32 i.e. the second harmonic, than for the fundamental mode 31.

Such increased displacement is used for improved performance, particularly improved gain. In particular, this is achieved in this embodiment by specifying the length of the trench 15 to fit to the x position where the maximum displacement 50 occurs, so that the sense current 22 passes across the MEMS piezoresistive resonator 8 at this location, and by performing resistive read-out at the frequency=211.14 MHz of the second eigenmode 32 i.e. the second harmonic.

A further refinement is that instead of considering simply displacement, including maximum displacement, one may consider slope of the displacement (with respect to x). Further details of this possibility are given below immediately following description of a further embodiment that includes a "straight MEMS piezoresistive resonator".

The above described first embodiment is merely one example of MEMS piezoresistive resonator 8 shape and dimensions, and choice of eigenmodes, and location of trench etc. that can be used. It will be appreciated by the skilled person that a wide range of other specific embodiments may be arrived at by considering and analysing different shapes of MEMS piezoresistive resonator 8 and carrying out trial or modelling predictions to assess the use of different higher orders of eigenmodes and/or different trench lengths etc.

Further background considerations and analysis will now be described with reference to FIGS. 4 to 6. The exact details of the dimensions etc. of the MEMS piezoresistive resonator considered in the following theoretical account are not necessarily identical to those of the MEMS piezoresistive resonator 8 in the above described embodiment; nevertheless the principles and insight provided are applicable thereto.

Force Balance

To calculate the frequencies at which stable standing pressure waves will occur in the dogbone resonator, the resonator is modelled as a rod with varying cross-section. The cross-sectional area A(x) leads to both the mass-per-meter m(x) and the stiffness EA(x) of the rod being discontinuous functions. The rod can be modelled as two connected rods, with conditions at both outer ends and conditions at the interface of the two. First, we derive the general differential equation that governs the standing waves in any rod.

At resonance, every single part of the material is displaced periodically, where a displacement U(x,t) can be expressed as $$U(x,t)=u(x)g(t), \text{ with } g(t)=\cos(\omega t) \qquad (1)$$

A general displacement profile will cause a strain $$\epsilon(x,t) = \frac{\partial U}{\partial x}, \qquad (2)$$

so that at any cross section a force $$F(x,t)=EA(x)\epsilon(x,t), \qquad (3)$$

where E is Young's modulus of elasticity, is acting on the surface. Cutting the rod at locations $x_2$ and $x_1$ therefore results in a resultant force acting on the isolated mass from $x_1$ to $x_2$. By writing $$F_2 - F_1 = EA(x)\frac{\partial U}{\partial x}\Big|_1^2 = \int_{x_1}^{x_2} \frac{\partial}{\partial x}\left[EA(x)\frac{\partial U}{\partial x}\right]dx, \qquad (4)$$

the 'forces at two surfaces' can be seen to be the result of integrating the derivative of their cause. This will prove to be useful when the force balance is completed.

A resultant force will accelerate a piece of mass, according to $F_{res}=ma$, where m is a mass and a is the acceleration. For an isolated piece of material in our vibrating rod, in between $x_1$ and $x_2$, mass and acceleration are defined as the integral $$\int_{x_1}^{x_2} \rho A(x)\frac{\partial^2 U}{\partial t^2}dx, \qquad (5)$$

where the material density ρ is used. The expressions (4) and (5) have to balance, resulting in $$\int_{x_1}^{x_2} \frac{\partial}{\partial x}\left[EA(x)\frac{\partial U}{\partial x}\right]dx = \int_{x_1}^{x_2} \rho A(x)\frac{\partial^2 U}{\partial t^2}dx. \qquad (6)$$

This balance should hold for any part of the rod-in-resonance, so we can drop the integration limits to arrive at $$\frac{\partial}{\partial x}\left[EA(x)\frac{\partial U}{\partial x}\right] = \rho A(x)\frac{\partial^2 U}{\partial t^2}, \quad (7)$$

on which separation of the variables t and x can be performed. By using $U=u(x)g(t)$ and by noting that $A(x)$ is non-constant, so that the product rule applies, we can write (by denoting the derivative in x with "'" and by denoting the derivative in t with "·") that $$E[A'u'g + Au''g] = \rho Au\ddot{g} \quad (8)$$
$$= \rho Au(-\omega^2)g,$$

since when $$g=\cos(\omega t), \text{ then } \ddot{g}=-\omega^2 \cos(\omega t) \quad (9)$$

Dividing both sides of Equation (8) by g results in $$E[Au']' = -\omega^2 \rho Au, \quad (10)$$

where ω is still unknown.

Boundary Conditions

The general formulation of standing waves or axial vibration of a rod with varying cross section is now written as $$E\frac{d}{dx}\left[A(x)\frac{du(x)}{dx}\right] = -\omega^2 \rho A(x)u(x), \quad (11)$$

from which eigenfrequencies ω and corresponding modal shapes u(x) can be found. This second-order differential equation holds for the rod as a whole, as well as for parts of it. Because of the discontinuous A(x), see FIG. 1, we define the function u(x) that we seek as $$u(x) = \begin{cases} u_1(x), & \text{for } 0 < x < L \\ u_2(x), & \text{for } L < x < (L+a). \end{cases} \quad (12)$$

FIG. 4 shows a characterisation of the geometry of the resonator (not to scale) of this theoretical treatment. Typical values for the various parameters shown in FIG. 4 are listed later below in Table 1.

Two second order equations require four boundary conditions, but since ω is also unknown, we need five. The conditions are summarized as $$u_1(0) = 0, \quad \text{since this end is fixed,} \quad (13)$$

$$\left.\frac{du_2(x)}{dx}\right|_{x=(L+a)} = 0, \quad \text{the free end has to be stain-free,}$$

$$u_1(L) = u_2(L), \quad \text{for continuity,}$$

$$u_2(L+a) = 1, \quad \text{or another scaling property,}$$

$$\left.A_1 \frac{du_1(x)}{dx}\right|_{x=L} = \left.A_2 \frac{du_2(x)}{dx}\right|_{x=L}, \quad \text{to be differentiable}$$

The last boundary condition follows from the fact that for the rod as a whole, the equation on both sides has to be continuous and differentiable. The mentioned scaling property stems from the fact that if u is a solution, then also 2u or 3u are solutions. To find the correct relative amplitudes of all found modes—there are infinite values ω and infinite functions u(x) that satisfy the equation—the modes will be normalized to the mass-function, according to $$\int_0^{L+a} m(x)[n_i u_i(x)]^2 = 1, \quad (14)$$

resulting in a normalization factor $n_i$ for the mode with index i.

For the two parts of the rod with cross sections $A_1$ and $A_2$, the general equation can be written as $$\frac{d}{dx}\left[A_{1,2}\frac{du_{1,2}(x)}{dx}\right] + \beta^2 u_{1,2}(x) = 0, \text{ where } \beta^2 = \frac{\omega^2 \rho}{E}. \quad (15)$$

Our solutions before applying the boundary conditions are $$u_1(x) = c_1 \cos(\beta x) + c_2 \sin(\beta x), \text{ and} \quad (16)$$

$$u_2(x) = c_3 \cos(\beta x) + c_4 \sin(\beta x). \quad (17)$$

The first boundary condition implies that $$u_1(0) = 0 \rightarrow c_1 = 0, \quad (18)$$

The scaling property described before is used to state $$c_2 = 1 \quad (19)$$

since one of the coefficients or amplitudes can be chosen. The strain-free end implies $$-c_3 \sin[\beta(L+a)]\beta + c_4 \cos[\beta(L+a)]\beta = 0, \text{ so } c_4 = c_3 \tan[\beta(L+a)]. \quad (20)$$

This is the first of three relations between $c_3$, $c_4$ and β. Using this expression for $c_4$, the continuity boundary condition can be expressed as $$c_3 = \cos[\beta(L+a)] \sec[a\beta] \sin[L\beta]. \quad (21)$$

Finally, the condition of differentiability, together with the expressions for $c_3$, and $c_4$, allows us to find values for β by $$\frac{A_1}{A_2} = \tan[L\beta]\tan[a\beta]. \quad (22)$$

Normalization

Equation (22) can be re-written in other periodic functions, but the general statement can be made, that solutions for the eigenfrequencies ω correspond to the values of β at which two harmonic functions of different period intersect. Using a found value of β, the values for $c_3$, and $c_4$, can be calculated. With $c_1=0$ and $c_2=1$, we can now present the modes corresponding to the eigenfrequencies. To scale these eigenfunctions properly with respect to each other, a normalization is undertaken, according to $$\int_0^L \rho A_1 [n^{(i)} u_1(x)]^2 + \int_L^{L+a} \rho A_2 [n^{(i)} u_2(x)]^2 = 1. \quad (23)$$

This results in normalization factors $n^{(i)}$ being $$[n^{(i)}]^2 = 2\beta/d\rho[-\omega(-2L\beta + \sin[2L\beta]) + b \sin[L\beta]^2 (a\beta \sec[a\beta]^2 + \tan[a\beta])], \quad (24)$$

where d is the resonator thickness. The modeshapes are $$u^{(i)}(x) = \begin{cases} n^{(i)} \sin[\beta^{(i)} x], & \text{for } 0 < x < L \\ n^{(i)} \{c_3 \cos[\beta^{(i)} x] + c_4 \sin[\beta^{(i)} x]\}, & \text{for } L < x < (L+a), \end{cases} \quad (25)$$

where $c_3$, and $c_4$ follow from Equations (21) and (20) respectively. FIG. 5 shows a plot the first four normalized eigenfunctions, in particular the fundamental eigenfrequency 61 at 26.58 Mhz, the second eigenfrequency 62 at 123.53 Mhz, the third eigenfrequency 63 at 208.77 Mhz, and the fourth eigenfrequency 64 at 267.076 Mhz. The fundamental mode is very similar to the simplified representation of a massless spring and a rigid mass: the strain $\epsilon = du/dx$ is nearly constant in the first part and much lower in the second part. The higher resonances show large amplitudes in the spring part. This is explained by considering an 'energy balance' between the two parts. To balance the deformation of the heavy resonator-head, the much lighter spring-part needs larger deformations. From FIG. 5, it can be observed that the boundary conditions are fulfilled: the two parts 'connect', start at zero and have $\epsilon = 0$ at the free end.

Result of Modelling

Analytical expressions for the eigenfrequencies as well as the eigenfunctions are derived. In the extreme cases where either a or L is reduced to zero, and the resonator reduces to a conventional rod of constant cross section, or when simply $A_1 = A_2$, all expressions remain valid. For such a rod, literature provides expressions that have the same results for $\omega$ and $u(x)$ as derived here.

TABLE 1

Values of the constants used in the numerical simulation.

| L | w | s | a | b | E | ρ |
|---|---|---|---|---|---|---|
| $20 \times 10^{-6}$ m | $10 \times 10^{-6}$ m | $1 \times 10^{-6}$ m | $35 \times 10^{-6}$ m | $64 \times 10^{-6}$ m | $181 \times 10^9$ Nm$^{-2}$ | 2329 kgm$^{-3}$ |

Effective Spring Constant

The mode shapes can also be normalized to unity-at-the-edge. This normalization is defined as $$q^{(i)} c_3 \cos[\beta^{(i)}(L+a)] + c_4 \sin[\beta^{(i)}(L+a)] = 1, \quad (26)$$

which is not necessary for the uniform rod, since these modes are all already found to end at unity. The reason for this normalization, however, lies in the practical field of determining the actuation gap size through the effective spring constant. Based on a found value of $\beta$, the normalization factors are $$q^{(i)} = \cos[a\beta] \csc[L\beta]. \quad (27)$$

With the normalization $q^{(i)}$ known, an expression for the effective spring constant $k_{eff}$ can be derived.

Consider the fundamental resonance at $\omega_0$ with corresponding mode shape $u(x)$. At resonance, Rayleigh's quotient (see L. Meirovitch, "Elements of vibration analysis", McGraw-Hill, 1986) is defined as $$R(u) = \omega_0^2 = \frac{V_{max}}{T}, \quad (28)$$

where $V_{max}$ is the maximum potential energy and T the reference kinetic energy. These values scale with vibration amplitude. A mass-spring system with a force F acting on the outer edge of the rigid mass, would induce a potential energy of $k\bar{x}^2$, where $\bar{x}$ denotes the displacement of the mass and hence the elongation of the spring. We consider now a harmonic force acting on the outer edge of the continuous resonator, exciting the resonator in its fundamental vibration shape, such that $u(L+a)=1$, resembling $\bar{x}=1$ in the equivalent mass-spring system.

Rayleigh's quotient R(u) is written as $$\omega_0^2 T = V_{max} = \frac{1}{2} k_{eff} u(L+a)^2, \quad (29)$$

where $u(L+a)=1$. The kinetic energy is by definition $$T = \frac{1}{2} \int_0^{L+a} m(x) u(x)^2 dx, \quad (30)$$

where again $u(L+a)=1$. In order to have the found functions $u_1$ and $u_2$ meet this unit amplitude at the end, they are multiplied by the normalization factor $q^{(i)}$, in this case $q_0$. The energy balance of Equation (29) can now be written as $$\omega_0^2 = \int_0^{L+a} m(x)(q_0 u(x))^2 dx = k_{eff}, \quad (31)$$

so that an effective spring constant can be calculated. The dimensions are checked to be [Nm$^{-1}$] as for a spring. For the general dogbone, the integral is split in two by writing $$q_0^2 \rho \omega_0^2 = \left[ \int_0^L A_1 u_1(x)^2 dx + \int_L^{L+a} A_2 u_2(x)^2 dx \right] = k_{eff}, \quad (32)$$

resulting in $$k_{eff} = q_0^2 \rho \omega_0^2 \begin{bmatrix} A_1 \left( \dfrac{L}{2} - \dfrac{\sin(2L\beta)}{4\beta} \right) + \\ A_2 \dfrac{\sec(a\beta)^2 (2a\beta + \sin(2a\beta)) \sin(L\beta)^2}{4\beta} \end{bmatrix}. \quad (33)$$

The effective mass $m_{eff}$ follows from the natural frequency and the found spring constant, using $q_0$ based on $\beta_0$ as in Equation (27).

Finding Intersections

The resonant frequencies, the shapes of the standing waves, the normalization factors and the effective spring constant all rely on found values of β. As stated, these values can be found from $$\frac{A_1}{A_2} = \tan(L\beta)\tan(a\beta). \tag{34}$$

For this equation, there is no mathematical expression to provide all intersections analytically. Next, we will present two different approximations to find only the first intersection.

Approximation One

The first approximation is a very accurate expression. However, this accurate expression is valid only when $A_1/A_2 \approx 1$, but was tested to hold up to a ratio of 4, or 1/4 alternatively. For most dogbone resonators, this is sufficient, but the generality for making either L or a zero, is lost, unfortunately. The first intersection, hence the value of $\beta_0$ is found at $$L\beta \simeq \sqrt{\frac{2}{1+\frac{a^2}{L^2}}} \arctan\left(\sqrt{\frac{\left(1+\frac{a^2}{L^2}\right)Lw}{ab}}\right). \tag{35}$$

Basically, a tan-function is fitted, of which the squared function approximates the product of the two different tan-functions in the original equation.

Approximation Two

The equation for the intersections can also be written as $$\left(1 - \frac{A_1}{A_2}\right)\cos[\beta(L-a)] = \left(1 + \frac{A_1}{A_2}\right)\cos[\beta(L+a)], \tag{36}$$

which can be seen as a long-period cosine starting just below 1, intersecting a short-period cosine starting just above 1, as depicted in FIG. 6, where FIG. 6 shows a representation of equation (36), more particularly a first curve 72 showing the left hand side of equation (36) and a second curve 74 showing the right hand side of equation (36). The eigenfrequencies correspond to the intersections of the first curve 72 and the second curve 74. This expression remains valid for all values of L and a, just as for any $A_1/A_2$.

The value $\beta_0$ can be approximated again from this expression, but cannot be found analytically. When both cosine-functions are approximated by a Taylor series expansion around β=0, the second order (or parabola) expressions yield an intersection at $$\beta_0^2 \simeq \frac{2w}{abL + (a^2 + L^2)w}, \tag{37}$$

which is very similar to the expressions found in other studies. The first resonant frequency is then $$\omega_0^2 = \frac{\beta_0^2 E}{\rho}, \tag{38}$$

with $\omega_0$, in radians per second.

Improving if Needed

Although exact expressions are not available, the two given approximations are useful. The first gives a very good estimate for a not-too-extreme dogbone and the second gives an estimate that is worse, but in formulation very convenient to use in e.g. designing a resonator for a certain operating frequency. Since for both approximations the un-approximated functional description is available, very good approximations can be found after a few iteration steps of a Newton-Rhapson root finding procedure.

Given an estimate $x_n$, an improved estimate $x_{n+1}$ can be found, according to $$x_{n+1} = x_n - \frac{f(x_n)}{f'(x_n)}. \tag{39}$$

Here, function $f(x)$ is a differentiable function of which the zero-crossings or roots are sought. Close to a root, this iteration will, generally, double the amount of correct digits in the estimate each time.

Implication for Resistive Sensing

The resonator is part of an oscillator. To oscillate, the output of the resonator is fed back with amplification to drive it again. The actuation is electrostatic, but the measured signal is obtained by using the piezoresistive properties of the material. Due to the piezoresistive effect, the material experiences a relative change in resistance, according to $$\frac{\Delta R}{R} = K\varepsilon, \tag{40}$$

Where K is the so-called gauge factor, which is a material property. A DC current through the spring-arms of the resonator will provide a voltage at the output that is modulated due to a changing $\varepsilon(t)$ at resonance.

Modeshapes u(x) for the dogbone resonator have been derived. The strain is $\varepsilon(x)=du/dx$, so that the piezoresistive effect, related to the total encountered strain, for the measurement current in the dogbone resonator is $$\frac{\Delta R}{R} = 2K \int_0^{x'} \frac{du(x)}{dx} dx = 2K[u(x') - u(0)], \tag{41}$$

where x' is the point of return, i.e. the point as explained in the above embodiment where the sense current is made to cross the MEMS piezoresistive resonator, e.g. by location of the end of the trench at that point. If the current follows a path that is a result of some implantation, the multiplication by a factor of 2 can be possibly be increased to 4 or 6. But for now, as the point x' is defined by the length of the trench, we can observe that for the present dog bone, the values $$u^{(1)}(L) = n^{(1)} \sin[\beta^{(1)}L] \text{ and } u^{(2)}(L) = n^{(2)} \sin[\beta^{(2)}L], \tag{42}$$

which are the normalized displacements at x'=L for modes 1 and 2, differ. This means that the to be measured resistive effect is larger, when the present dogbone resonator is excited at the second resonance.

When an optimized dogbone resonator is manufactured, the resistive effect can be amplified even further by reducing the length of the trench. The value for x', which is the length of the trench, so that 0<x'<L, is found as the point where u(x)

has the first maximum. It can be found as the first zero of the derivative, resulting in $$\left.\frac{du_1(x)}{dx}\right|_{x=x'} = \beta^{(i)} n^{(i)} \cos[\beta^{(i)} x'] = 0. \quad (43)$$

Neglecting the amplitude, the value for x' is found to be $$\beta^{(i)} x' = \frac{1}{2}\pi, \quad (44)$$

so that $$x' = \frac{\pi}{2\beta^{(i)}}.$$

For each resonant mode, the optimum x' can be calculated.

Trade-Off

The function $\epsilon(x)=du/dx$ shows that the highest stresses, since $\sigma=E\epsilon$, will occur in the first part of the resonator, since, generally, the amplitudes of u(x) are higher in the first part. The period of the standing wave is related to β and is equal in both parts of the resonator. Because u(0)=0, the highest stress can be stated to occur at x=0. Driving the resonator in higher modes than the fundamental mode, causes higher stresses, as the slopes in u(x) get larger. The maximum stress will be larger, compared to the fundamental mode, by a factor of $$\frac{\epsilon_{max}^{(i)}}{\epsilon_{max}^{(1)}} = \frac{\beta^{(i)} n^{(i)} \cos(0)}{\beta^{(1)} n^{(1)} \cos(0)}, \quad (45)$$

where the cos-factor indicates the use of the derivative of $u_1$.

For the dogbone under consideration, while assuming that the trench would have an optimized length, this could provide a nearly 4 times higher strain signal, when exciting it in the third mode rather than in the first one. For this mode the trench length should be x'=0.53 L. The signal gain of a factor of 4 comes with a gain of nearly 10 in the maximum stress that occurs.

This has now completed the above mentioned theoretical account provided with reference to FIGS. 4-6. Further comments that relate to some of the theoretical account are given below immediately following description of a further embodiment that includes a "straight MEMS piezoresistive resonator".

It will be appreciated from the above description of the first embodiment and also the theoretical account that the skilled person may analyse and select different eigenmodes as required, according to the details of a specific MEMS piezoresistive resonator under consideration. For example, although in the above described first embodiment the second eigenmode gave the largest gain, for other MEMS piezoresistive resonators of different shapes and dimensions other eigenmodes may provide the largest gain.

Furthermore, the skilled person may decide to implement other embodiments where a given eigenmode is used even if it is not the eigenmode that provides the highest gain. Yet further, the skilled person may decide to implement embodiments where the sense current is made to cross the MEMS piezoresistive resonator at a point that does not represent the highest gain for the chosen eigenmode.

The skilled person may use any appropriate analysis approach (or combination of analysis approaches), for example employing trial and error, to arrive at a chosen eigenmode and/or current crossing location. For example, mathematical modelling may be employed, or actual MEMS piezoresistive resonators may be built and driven at different frequencies etc. on a trial and error basis.

In the above embodiments, by virtue of locating the end of the trench before the start of the head, the remaining part of the beams comprises in fact a single wide portion comprising the width of the two beams plus the width of the trench. However, this need not be the case. For example, FIG. 7 shows (not to scale) a further embodiment of a MEMS piezoresistive resonator 78, in which the trench is still shortened to provide a specified point for the sense current to cross the MEMS piezoresistive resonator 78, but in which the MEMS piezoresistive resonator 78 is further modified to retain separate beams up to the point where they meet the head. In FIG. 7, again for simplicity, the MEMS piezoresistive resonator is shown in the same format as in FIG. 2, that is only the structure located at one side of the anchors 9, 10 is shown. Moreover, the same reference numerals have been used to show the same parts, i.e. the first anchor 9, the second anchor 10, the first beam 11, the second beam 12, the first head 16, and the approximate route of the sense current 22, in particular where (shown by reference numeral 22') the sense current 22 crosses the MEMS piezoresistive resonator 78 at the end of the trench 15. However, the MEMS piezoresistive resonator 78 of FIG. 7 differs over the earlier MEMS piezoresistive resonator 8 of FIG. 2 by virtue of a further trench space 15' provided such that the sense current 22' crossing the MEMS piezoresistive resonator 78 does so at a narrow bridging portion 79 extending between the first beam 11 and the second beam 12. A corresponding bridging portion and further trench space is provided at the other side of the anchors 9, 10, i.e. between the third beam 13 and the fourth beam 14. In effect, this embodiment achieves a determination of the sense current crossing point without the need to remove as much of the parallel beam structure as is removed in the first embodiment.

In the above embodiments the MEMS piezoresistive resonator is a so-called dogbone resonator, i.e. is shaped with a head (mass) part at each end that is wider than the beam (spring) part. However, in other embodiments other shapes of resonator may be used, and their higher order eigenmodes exploited. For example, a straight MEMS piezoresistive resonator may be used, i.e. one in which the overall footprint taken up by the beams is the same width as that of the heads. In fact, with such a shape, there is effectively no distinction between a mass and a spring as such; longitudinal vibration modes are continuous standing pressure waves of uniform amplitude throughout the body. Further details of a suitable structure of a straight MEMS piezoresistive resonator are given in WO2004/053431, the contents of which are incorporated herein by reference.

In the above description, the aspect of improved displacement has been concentrated on. However, another possibility is to consider slope of the displacement (with respect to x). The derivative of displacement is strain, and increasing this increases the output signal, i.e. gain. This applies to both dogbone MEMS piezoresistive resonators and straight MEMS piezoresistive resonators. That is, straight MEMS piezoresistive resonators are capable of higher gain using eigenmodes other than the fundamental eigenmode even though it would not particularly be expected to exhibit higher maximum displacement along the body compared to its fundamental mode, since it does nevertheless exhibit steeper derivatives when using eigenmodes other than the fundamental eigenmode.

Such consideration of derivative of displacement leads to further possibilities for optimising or otherwise choosing the position where the sense current should cross the MEMS piezoresistive resonator, in addition or as an alternative to the above described choice made to optimise displacement. Up until this position the derivative is positive, hence a contribution to the resistive readout is made along the walk from origin to the above selected sense current crossing point. However, one may further consider that besides wanting to run the current through regions of high derivative (strain), it is also desirable to keep the current path as short as possible, to reduce the overall resistance along the sense path. If this is of interest, then one possibility for defining the best sense current crossing point may be considered as "in between the origin and the point of maximum displacement", since the strain gradually decreases to be zero at the point of maximum displacement. Note how this differs to the prior art use of fundamental eigenmode where the strain is constant all along the beams, and hence the choice of sense current crossing point has no effect.

In the above embodiments the trench 15 (and where included the further trench space 15') comprises a low-pressure gas or vacuum, the MEMS piezoresistive resonator being encapsulated. Another possibility is that the trench 15 (and where included the further trench space 15') is air. In other embodiments the trench 15 (and where included the further trench space 15') may be any suitable material, such as a dielectric material, whose electrical conductivity is lower than that of the beams, such that the sense current follows a route that excludes the trench.

In further embodiments, the materials and form of the MEMS piezoresistive resonator may be varied compared to the above described embodiments. For example, the MEMS piezoresistive resonator need not be "dogbone" shaped nor straight in that any other suitable shapes may be used. Furthermore, the beams and anchor may be replaced by alternative structures. Yet further, a MEMS piezoresistive resonator may be used that has less symmetry than the one described above, for example there may be a head and beams on only one side of the anchors.

The invention claimed is:

1. A method of operating a MEMS piezoresistive resonator;
   the method comprising driving the MEMS piezoresistive resonator at a higher order eigenmode than the fundamental eigenmode.

2. A method according to claim 1, further comprising arranging a route of flow of a sense current in relation to a characteristic of the higher order eigenmode.

3. A method according to claim 2, wherein the route of flow of the sense current is arranged in relation to the characteristic of the higher order eigenmode by being at a point of maximum displacement of the higher order eigenmode.

4. A method according to claim 2, wherein the route of flow of the sense current is arranged in relation to the characteristic of the higher order eigenmode by being at a point of maximum rate of change with respect to distance of displacement of the higher order eigenmode.

5. A method according to claim 2, wherein the route of flow of the sense current is arranged by locating the end point of a trench of the MEMS piezoresistive resonator at a position determined in relation to the characteristic of the higher order eigenmode, the trench being formed between two beams of the MEMS piezoresistive resonator.

6. A MEMS piezoresistive resonator comprising a trench formed between two beams, the end of the trench located at a position of maximum displacement or maximum rate of change with respect to distance of displacement of a higher order eigenmode of the MEMS piezoresistive resonator.

7. A MEMS piezoresistive resonator according to claim 6, wherein the MEMS piezoresistive resonator further comprises a head that is wider than the width of the overall footprint of the two beams, and wherein the end of the trench is located at a point along the beams that is before where the beams reach the head.

8. A MEMS piezoresistive resonator system;
   the system comprising:
   a MEMS piezoresistive resonator; and
   a driver for the MEMS piezoresistive resonator arranged to drive the MEMS piezoresistive resonator at a frequency of a higher order eigenmode than the fundamental eigenmode of the MEMS.

* * * * *